United States Patent [19]

Naito

[11] 4,309,649
[45] Jan. 5, 1982

[54] PHASE SYNCHRONIZER

[75] Inventor: Michinori Naito, Tokyo, Japan

[73] Assignee: Trio Kabushiki Kaisha, Tokyo, Japan

[21] Appl. No.: 66,771

[22] Filed: Aug. 15, 1979

[30] Foreign Application Priority Data

Sep. 7, 1978 [JP] Japan .................................. 53-109908

[51] Int. Cl.³ .............................................. G05F 5/00
[52] U.S. Cl. .................................... 323/212; 307/510; 328/155
[58] Field of Search ....................... 307/232, 262, 263; 323/108, 212, 213, 217; 328/56, 133, 155

[56] References Cited

U.S. PATENT DOCUMENTS

| | | | |
|---|---|---|---|
| 3,195,068 | 7/1965 | Du Vall | 307/232 X |
| 3,199,037 | 8/1965 | Graves | 328/133 X |
| 3,436,647 | 4/1969 | Gobeli et al. | 307/262 X |
| 3,919,647 | 11/1975 | Haass | 307/262 X |
| 4,039,930 | 8/1977 | Lukas | 323/108 |

*Primary Examiner*—William M. Shoop
*Attorney, Agent, or Firm*—Gerald J. Ferguson, Jr.; Joseph J. Baker

[57] ABSTRACT

A phase synchronizer for obtaining a signal which is phase synchronized with respect to another signal which has passed through a transmission system after originating at a signal source, the phase synchronizer comprising a variable phase shifter responsive to the output signal of the signal source for shifting the phase thereof in response to a control signal applied thereto; a phase comparator responsive to the signal which has passed through the transmission system and the output signal of the variable phase shifter to provide an output signal indicative of the phase difference between the two signals applied thereto; a low-pass filter responsive to the phase comparator output signal to provide the control signal for the variable phase shifter so that the phase of the output signal of the variable phase shifter follows the phase of the transmission system output signal.

3 Claims, 7 Drawing Figures

U.S. Patent     Jan. 5, 1982     4,309,649
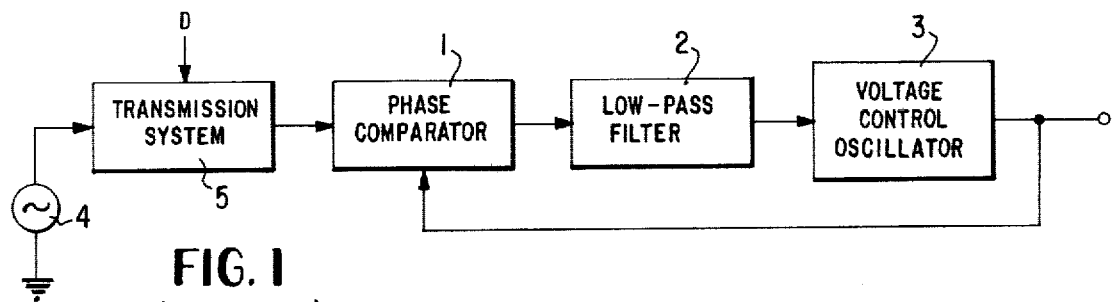
FIG. 1
(PRIOR ART)
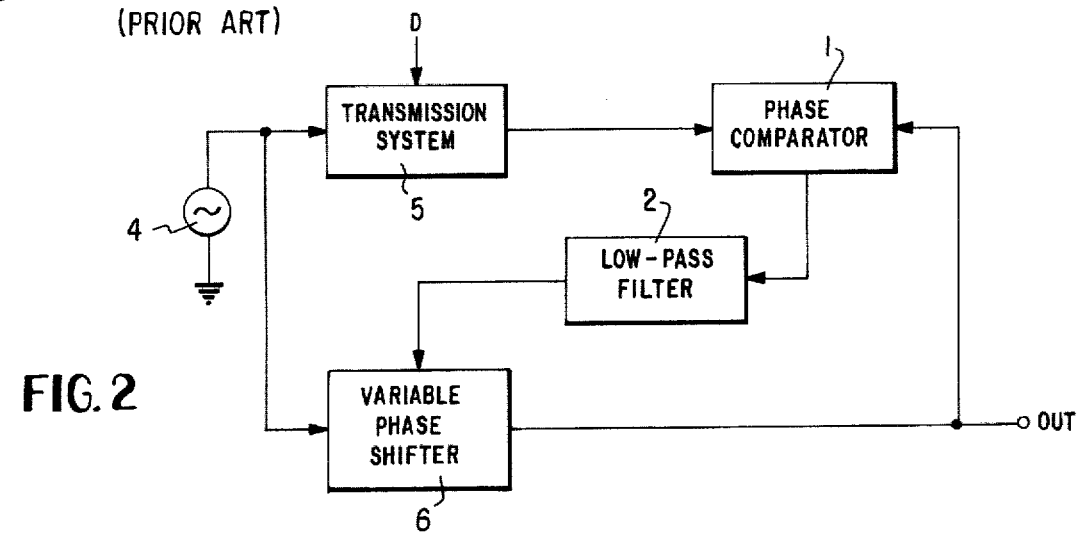
FIG. 2
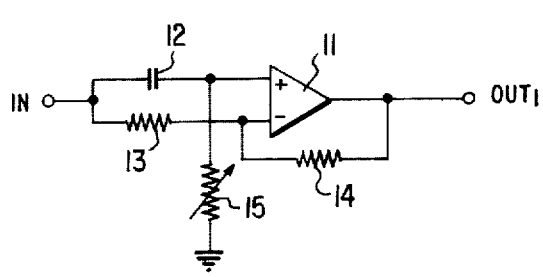
FIG. 3a
(PRIOR ART)
FIG. 3b
(PRIOR ART)
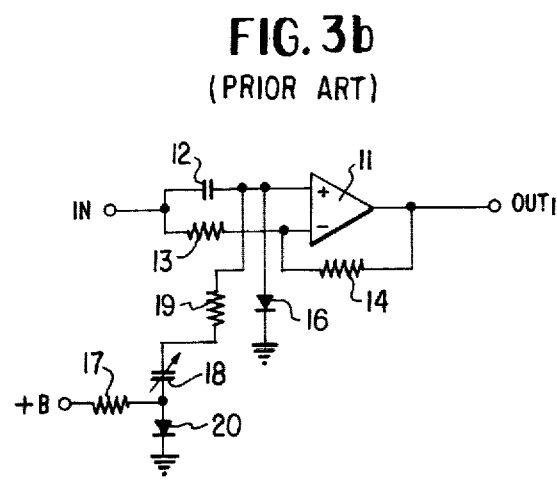
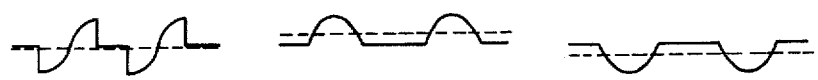
FIG. 4c     FIG. 4a     FIG. 4b

4,309,649

PHASE SYNCHRONIZER

BACKGROUND OF THE INVENTION

1. Field of the Invention

This invention relates to a phase synchronizer.

2. Discussion of Prior Art

Generally, when a signal passes through a transmission system, the signal level and phase change. If these changes are indeterminate and fluctuate in accordance with the transmission system or environment and if it is desired to obtain an output with a certain fixed phase with respect to the signal which has passed through the transmission system, a phase-locked-loop (PLL hereafter) circuit is normally used. As shown in FIG. 1, a PLL circuit typically comprises a phase comparator 1, a low-pass filter 2 and a voltage controlled oscillator 3. 4 is a signal source, 5 is a transmission system and D indicates disturbance of the transmission system.

Although a PLL circuit can readily obtain a stable output signal having a fixed phase relation with respect to and the same frequency as the input signal where the input signal is a weak signal with poor signal-to-noise (S/N), the input noise-eliminating capability of the PLL circuit is virtually determined by the capture range thereof. Consequently, when the time constant of the low-pass filter is increased and the capture range narrowed, the selectivity of the PLL circuit improves and the input noise-eliminating capability increases so that a signal with good S/N is obtained as an output even when the S/N is poor. However, in order for the PLL circuit to lock on the input signal, the capture range cannot be narrowed to an extreme—that is, a certain width is always necessary. Consequently, there is a shortcoming in that the output signal of a PLL circuit also contains a certain amount of noise as a phase component when the S/N of the input signal is poor. Also, because of the capture range of the PLL circuit, the voltage controlled oscillator must have low drift or a variable resistor for adjusting the voltage controlled oscillator is necessary.

SUMMARY OF THE INVENTION

This invention was made in view of the above problems and an object is to provide a phase synchronizer from which an output signal having a fixed phase with respect to and the same frequency as the input signal is obtainable, the S/N being good even when the input signal S/N is poor without using a voltage controlled oscillator.

Other objects and advantages of this invention will be apparent from a reading of the following specification and claims taken with the drawing.

BRIEF DESCRIPTION OF THE DRAWING

FIG. 1 is a block diagram of a conventional PLL circuit.

FIG. 2 is a block diagram of an illustrative phase synchronizer in accordance with this invention.

FIGS. 3(a) and (b) are circuit diagrams of variable phase shifters.

FIGS. 4(a), (b) and (c) are waveforms provided for explaining the functions of the embodiment of FIG. 2.

DETAILED DESCRIPTION OF PREFERRED EMBODIMENTS OF THE INVENTION

Reference should be made to the drawing where like reference numerals refer to like parts.

FIG. 2 is a block diagram of an illustrative phase synchronizer in accordance with this invention. The output signal of signal source 4 is applied to the input terminal on one side of phase comparator 1 through transmission system 5. The output signal of signal source 4 is also directly applied to a first input terminal of a variable phase shifter 6. The output of phase comparator 1 is applied as a control signal to a second input terminal of variable phase shifter 6 through a low-pass filter 2. The output of variable phase shifter 6 is applied to the other input terminal of phase comparator 1. The output signal of signal source 4 which has passed transmission system 5 and the output signal of variable phase shifter 6 are thus phase compared by phase comparator 1 and the output of the phase synchronizer is obtained from the output terminal of variable phase shifter 6 where OUT is the output terminal of the phase synchronizer. Variable phase shifter 6 continuously shifts the phase of the input signal applied to the first input terminal thereof in response to the control signal applied to the second input terminal thereof and outputs it as the phase synchronized signal.

FIG. 3(a) is a block diagram of one embodiment of variable phase shifter 6. This variable phase shifter, as is known, comprises an operational amplifier 11, a capacitor 12 connected between the input terminal IN and the non-inverting input terminal of operational amplifier 11, a resistor 13 connected between the input terminal IN and the inverting input terminal of the operational amplifier, a feedback resistor 14 connected between the output terminal and the inverting input terminal of the operational amplifier 11 and a variable resistor 15 connected between the non-inverting input end of the operational amplifier 11 and ground. $OUT_1$ is the output terminal of the variable phase shifter.

Assuming the resistance values of resistor 13 and feedback resistor 14 are equal, the phase characteristic, $\beta(\omega)$, is $\beta(\omega)=2\tan^{-1}\omega/\omega_0$, where $\omega_0=1/CR$, C being the capacitance of capacitor 12, R being the resistance of the variable resistor 15, and $\omega$ being the angular frequency of the input signal. Thus, when the resistance of variable resistor 15 is such that $\omega CR=1$, an ouput signal whose phase is delayed by 90° with respect to the input signal to the variable phase shifter can be obtained. By assuming $\omega$ is fixed and changing the resistance of variable resistor 15, the phase can be changed by ±90° with respect to the center phase of the output signal when $\omega CR=1$ so that the input signal of the variable phase shifter can be outputted at the output terminal $OUT_1$ of the variable phase shifter with a phase delay of 0°–180°.

The variable phase shifter 6 used in the preferred embodiment of this invention is as shown in FIG. 3(b). The non-inverting input of operational amplifier 11 is grounded through a diode 16 instead of the variable resistor 15 of FIG. 3(a). Further, the DC power supply +B and an external control signal voltage source 18 are connected in series through a resistor 17. The voltage of this serially connected power supply is applied to the anode of diode 16 through a resistor 19 so that a biased voltage is impressed on the diode. A diode 20 is used for temperature compensation.

The forward resistance of diode 16 is in parallel with resistor 19, this parallel resistance corresponds to the resistance of variable resistor 15. By changing the voltage of external control signal voltage source 18, the parallel resistance changes and an output signal whose phase is shifted with respect to the input signal applied to input terminal IN is obtained at output terminal OUT$_1$. The output signal of low-pass filter 2 of FIG. 2 is the external control signal voltage.

Returning now to the phase synchronizer of FIG. 2, the output signal of signal source 4 which has passed transmission system 5 and disturbed by external disturbance D has the same frequency as and a fixed phase relationship with respect to the output signal of signal source 4 at phase shifter 6. The phase comparator outputs at low-pass filter 2 an output signal corresponding to the phase difference ranging from the case of no phase difference between the input signals applied thereto as shown by the dotted line in FIG. 4(a) to the case of a 180° phase difference as shown by the dotted line in FIG. 4(b). In particular, when there is no phase difference between the two input signals of phase comparator 1, the output waveform thereof is as shown in FIG. 4(a) by the solid line. The application of this waveform to low-pass filter 2 produces a DC voltage of (+) polarity as shown in FIG. 4(a) by the dotted line. This DC voltage is applied to the second input terminal of variable phase shifter 6 as a control signal therefor.

When there is a phase difference of 180° between the two input signals of phase comparator 1, the output waveform thereof is as shown in FIG. 4(b) by the solid line. The application of this waveform to low-pass filter 2 produces a DC voltage of (−) polarity as shown in FIG. 4(b) by the dotted line. This DC voltage then becomes the control signal of variable phase shifter 6.

When there is a phase difference of 90° between the two input signals of phase comparator 1, the output waveform thereof is as shown in FIG. 4(c) by the solid line. Application of this waveform to low-pass filter 2 produces a zero output voltage as shown in FIG. 4(c) by the dotted line. This output then becomes the control signal for variable phase shifter 6. In summary, the output of phase comparator 1 corresponds to a phase difference of 0°-180° between the two input signals applied thereto and the output signal of low-pass filter 2 is in a DC voltage, the polarity of which ranges from positive to negative.

The operation of variable phase shifter 6 may be such that the input signal thereto is phase delayed by 90° when the control signal voltage of 0 volts (this is the state of $\omega CR = 1$ described above with respect to FIG. 3(a), resistor 19 being so selected that $\omega CR = 1$ results when the external control signal voltage 18 is zero). Further, the phase of first input signal may be advanced with respect to its phase when the control signal voltage is zero volts in response to a signal voltage of (+) polarity. Also, the phase of the first input signal would be delayed with respect to its phase when the control signal voltage is zero volts in response to a control signal voltage of (−) polarity. Thus, when the two input signals to the phase comparator 1 are in the same phase (as in FIG. 4(a)), the phase of the input signal to the variable phase shifter is advanced. When there is a phase difference of 180° between the two input signals to the phase comparator (as in FIG. 4(b)), the phase of the input signal to the phase shifter is delayed. The phase of the output signal of variable phase shifter 6 will be shifted until there is a 90° difference between the input signals to phase comparator 1 so that a phase shifter output signal is produced at output terminal OUT having the same frequency as and a 90° phase difference with respect to the output signal of signal source 4 that has passed transmission system 5.

Thus, unlike the conventional PLL circuit, no lock-in procedure exists and the frequency is the same at all times. Thus, even if the time constant of low-pass filter 2 is increased considerably, the action of the system is not interrupted. Consequently, the input signal, that is the output signal of the signal source that has passed the transmission system can be obtained as an output with improved and more favorable S/N than is available from the conventional PLL circuit. Furthermore, the output signal of variable phase shifter 6 is provided with selectivity by low-pass filter 2 with respect to the output signal of signal source 4 that has passed transmission system 5 and this selectivity can be made very high.

In summary, an output signal with improved S/N having the same frequency as and a fixed phase relationship with respect to the output signal of a signal source that has passed through a transmission system can be obtained without using a voltage controlled oscillator, regardless of the characteristics of the transmission system and even when the S/N of the output signal of the signal source that has passed the transmission system is poor. Further, an output signal with an S/N improved with respect to the case where a conventional PLL circuit is used can be obtained.

Furthermore, adjustment is unnecessary and selectivity can be increased.

It is to be understood that the above detailed description of the various embodiments of the invention is provided by way of example only. Various details of design and construction may be modified without departing from the true spirit and scope of the invention as set forth in the appended claims.

What is claimed is:

1. Circuitry for obtaining a signal which is phase synchronized with respect to another signal which has passed through a transmission system after originating at a signal source, said circuitry comprising
   said transmission system wherein the phase of said another signal indeterminately fluctuates due to the transmission system characteristics or the environment thereof;
   a variable phase shifter responsive to the output signal of said signal source for shifting the phase thereof in response to a control signal applied thereto;
   a phase comparator responsive to the signal which has passed through the transmission system and the output signal of the variable phase shifter to provide an output signal indicative of the phase difference between the two signals applied thereto; and
   a low-pass filter responsive to said phase comparator output signal to provide said control signal for the variable phase shifter so that the phase of the output signal of the variable phase shifter follows the phase of the transmission system output signal.

2. The circuitry as in claim 1 where variable phase shifter shifts the phase of the input signal thereto 90° when the control signal is zero volts and the phase comparator and the low-pass filter produce the zero volt control signal when there is a 90° phase difference between the signals applied to the phase comparator so that a 90° phase difference is maintained between the output of the variable phase shifter and the output of the transmission system.

3. Circuitry for obtaining a signal which is phase synchronized with respect to another signal which has passed through a transmission system after originating at a signal source, said circuitry comprising said transmission system wherein the phase of said another signal indeterminately fluctuates due to the transmission system characteristics or the environment thereof, a phase comparator, a low-pass filter fed by the output of the phase comparator, and a variable phase shifter that has applied thereto (a), as a first input signal, the output signal of the signal source and (b), as a control signal, the output signal of the low-pass filter to output a signal by continuously changing the phase of the first input signal in response to the control signal; the output signal of the transmission system and the output signal of the variable phase shifter being applied to the phase comparator for phase comparison; and the phase synchronized signal being obtained from the output terminal of the variable phase shifter.

* * * * *